(12) United States Patent
Kuribayashi et al.

(10) Patent No.: US 6,175,345 B1
(45) Date of Patent: Jan. 16, 2001

(54) ELECTROLUMINESCENCE DEVICE, ELECTROLUMINESCENCE APPARATUS, AND PRODUCTION METHODS THEREOF

(75) Inventors: Masaki Kuribayashi, Inagi; Yuichi Hashimoto; Akihiro Senoo, both of Tokyo; Kazunori Ueno, Ebina; Hidetoshi Tsuzuki, Yokohama, all of (JP)

(73) Assignee: Canon Kabushiki Kaisha, Tokyo (JP)

( * ) Notice: Under 35 U.S.C. 154(b), the term of this patent shall be extended for 0 days.

(21) Appl. No.: 09/084,994

(22) Filed: May 28, 1998

(30) Foreign Application Priority Data

Jun. 2, 1997 (JP) ................................ 9-143836
Jun. 10, 1997 (JP) ................................ 9-152309

(51) Int. Cl.$^7$ ............................. G09G 3/30; G09G 3/10; H01L 31/00; H01J 1/62
(52) U.S. Cl. ..................... 345/76; 315/169.3; 257/448; 313/506
(58) Field of Search ............... 345/33–36, 44–45, 345/55, 92, 76–81; 315/169.3; 313/500–520; 257/59, 448; 349/42

(56) References Cited

U.S. PATENT DOCUMENTS

| | | | |
|---|---|---|---|
| 4,006,383 | * 2/1977 | Luo et al. | 315/169 TV |
| 4,042,854 | * 8/1977 | Luo et al. | 313/505 |
| 4,356,429 | 10/1982 | Tang | 313/503 |
| 4,445,132 | * 4/1984 | Ichikawa et al. | 357/32 |
| 4,539,507 | 9/1985 | VanSlyke et al. | 313/504 |
| 4,618,802 | * 10/1986 | Schrank | 313/512 |
| 4,720,432 | 1/1988 | Van Slyke et al. | 428/457 |
| 4,769,292 | 9/1988 | Tang et al. | 428/690 |
| 4,776,676 | 10/1988 | Inoue et al. | 350/350 |
| 4,885,211 | 12/1989 | Tang et al. | 428/457 |
| 4,904,989 | * 2/1990 | Matsui et al. | 345/76 |
| 4,950,950 | 8/1990 | Perry et al. | 313/504 |
| 4,954,747 | * 9/1990 | Tuenge et al. | 313/506 |
| 5,047,687 | 9/1991 | VanSlyke | 313/503 |
| 5,059,861 | 10/1991 | Littman et al. | 313/503 |
| 5,059,862 | 10/1991 | VanSlyke et al. | 313/503 |
| 5,061,617 | 10/1991 | Maskasky | 430/569 |
| 5,073,446 | 12/1991 | Scozzafava et al. | 428/323 |
| 5,079,483 | * 1/1992 | Sato | 315/169.3 |
| 5,151,629 | 9/1992 | VanSlyke | 313/504 |
| 5,294,869 | 3/1994 | Tang et al. | 313/504 |
| 5,294,870 | 3/1994 | Tang et al. | 313/504 |
| 5,302,966 | * 4/1994 | Stewart | 345/76 |
| 5,539,424 | * 7/1996 | Hattori et al. | 345/76 |
| 5,670,792 | * 9/1997 | Utsugi et al. | 257/59 |
| 5,684,365 | * 11/1997 | Tang et al. | 315/169.3 |
| 5,714,968 | * 2/1998 | Ikeda | 345/77 |
| 5,844,362 | * 12/1998 | Tanabe et al. | 313/506 |

FOREIGN PATENT DOCUMENTS

| | | |
|---|---|---|
| 0 349 265 | 1/1990 | (EP) . |
| 6-136360 | 5/1994 | (JP) . |
| 6-188074 | 7/1994 | (JP) . |
| 6-192654 | 7/1994 | (JP) . |
| 6-256759 | 9/1994 | (JP) . |
| 8-41452 | 2/1996 | (JP) . |
| 8-241048 | 9/1996 | (JP) . |

* cited by examiner

Primary Examiner—Vijay Shankar
Assistant Examiner—Jeff Piziali
(74) Attorney, Agent, or Firm—Fitzpatrick, Cella, Harper & Scinto

(57) ABSTRACT

An electroluminescence device having a transistor substrate comprising drain electrode pads, each being connected to a drain of a thin film transistor, and capacitors connected to the respective drain electrode pads, and an electroluminescence substrate comprising pairs of electrodes and electroluminescence members each provided between a pair of electrodes, arranged along a plurality of rows and columns, wherein the thin film transistor substrate and the electroluminescence substrate are placed opposite to each other so that the drain electrode pads and the electroluminescence members are opposed to each other, and wherein each drain electrode pad and one electrode of a pair of electrodes are connected through an adhesive electric connection member.

30 Claims, 7 Drawing Sheets

ELECTROLUMINESCENCE DEVICE, ELECTROLUMINESCENCE APPARATUS, AND PRODUCTION METHODS THEREOF

BACKGROUND OF THE INVENTION

1. Field of the Invention

The present invention relates to an electroluminescence device and an electroluminescence apparatus applicable to display devices, light-emitting sources, or printer heads of electrophotographic printers, and methods for producing them. More particularly, the invention relates to a device and an apparatus using organic electroluminescence members suitable for full-color display of large screen, and methods for producing them.

2. Related Background Art

The known organic electroluminescence members are, for example, those disclosed in Japanese Laid-Open Patent Applications No. 6-256759, No. 6-136360, No. 6-188074, No. 6-192654, and No. 8-41452.

It is also known that these organic electroluminescence members are driven by thin film transistors, for example, as described in Japanese Laid-Open Patent Application No. 8-241048.

For driving the organic electroluminescence members by the thin film transistors, an organic electroluminescence member had to be mounted per drain electrode pad of thin film transistor, however. Particularly, in the case of the full-color display, the electroluminescence members of three kinds for electroluminescence emission of the three primary colors, blue, green, and red, had to be patterned on a thin film transistor substrate. Since the thin film transistor surface had greater unevenness than thin films of the electroluminescence members, it was difficult to pattern the thin films of electroluminescence members in high definition and high density. A further problem was that productivity was low, because the two types of functional devices, the transistors and electroluminescence members, were concentrated on the thin film transistor substrate.

The organic electroluminescence members had a further problem that long-term application of dc voltage thereto shortened continuous emission time. Particularly, when they were driven by the thin film transistors disclosed in Japanese Laid-Open Patent Application No. 8-241048 etc., there arose a problem that the dc voltage was continuously applied to the organic electroluminescence members, so as to promote deterioration of the organic electroluminescence members.

SUMMARY OF THE INVENTION

An object of the present invention is to provide a device using organic electroluminescence members suitable for full-color display of large screen, solving the above problems, and a production method thereof.

Another object of the present invention is to provide an electroluminescence apparatus capable of continuous emission over the long term.

First, the present invention has the first feature of an electroluminescence device having a transistor substrate comprising thin film transistors arranged along a plurality of rows and columns, gate lines provided for the respective rows, each gate line being a common line for connecting gates of thin film transistors on one of the rows, source lines provided for the respective columns, each source line being a common line for connecting sources of thin film transistors on one of the columns, drain electrode pads each connected to a drain of the respective thin film transistors, and capacitors connected to the respective drain electrode pads; and an electroluminescence substrate comprising pairs of electrodes and electroluminescence members interposed between the pairs of electrodes, which are arranged along a plurality of rows and columns, wherein said thin film transistor substrate and electroluminescence substrate are placed opposite to each other so that the drain electrode pads and the electroluminescence members are opposed to each other, and wherein each drain electrode pad is connected through an adhesive electric connection member to one of a pair of electrodes.

Second, the present invention has the second feature of an electroluminescence device having a transistor substrate comprising first thin film transistors arranged along a plurality of rows and columns, gate lines provided for the respective rows, each gate line being a common line for connecting gates of first thin film transistors on one of the rows, source lines provided for the respective columns, each source line being a common line for connecting sources of first thin film transistors on one of the columns, second thin film transistors each connected to a drain of the respective first thin film transistors, and capacitors connected to the respective second thin film transistors, wherein a gate of each second thin film transistor is connected to the drain of the first thin film transistor, a drain electrode pad is connected to a drain of each second thin film transistor, and a source of each second thin film transistor is connected to one electrode of the capacitor; and an electroluminescence substrate comprising pairs of electrodes and electroluminescence members interposed between the pairs of electrodes, which are arranged along a plurality of rows and columns, wherein said thin film transistor substrate and electroluminescence substrate are placed opposite to each other so that the drain electrode pads and the electroluminescence members are opposed to each other, and wherein each drain electrode pad is connected through an adhesive electric connection member to one of a pair of electrodes.

Third, the present invention has the third feature of a production method of electroluminescence device comprising steps of: preparing a transistor substrate comprising thin film transistors arranged along a plurality of rows and columns, gate lines provided for the respective rows, each gate line being a common line for connecting gates of thin film transistors on one of the rows, source lines provided for the respective columns, each source line being a common line for connecting sources of thin film transistors on one of the columns, drain electrode pads each connected to a drain of the respective thin film transistors, and capacitors connected to the respective drain electrode pads; preparing an electroluminescence substrate comprising pairs of electrodes and electroluminescence members interposed between the pairs of electrodes, which are arranged along a plurality of rows and columns; placing an adhesive electric connection member on at least one of the drain electrode pads of the transistor substrate and the electroluminescence members; and overlaying the thin film transistor substrate on the electroluminescence substrate opposite to each other so that the drain electrode pads and the electroluminescence members are opposed to each other.

Fourth, the present invention has the fourth feature of a production method of electroluminescence device comprising steps of: preparing a transistor substrate comprising thin film transistors arranged along a plurality of rows and columns, gate lines provided for the respective rows, each gate line being a common line for connecting gates of thin film transistors on one of the rows, source lines provided for the respective columns, each source line being a common line for connecting sources of thin film transistors on one of the columns, drain electrode pads each connected to a drain of the respective thin film transistors, and capacitors connected to the respective drain electrode pads; preparing an electroluminescence substrate comprising pairs of electrodes and electroluminescence members interposed between the pairs of electrodes, which are arranged along a plurality of rows and columns; placing an adhesive electric connection member on at least one of the drain electrode pads of the transistor substrate and the electroluminescence members; placing an adhesive electric insulator around the periphery of the adhesive electric connection member on at least one of the drain electrode pads of the transistor substrate and the electroluminescence members; and overlaying the thin film transistor substrate on the electroluminescence substrate opposite to each other so that the drain electrode pads and the electroluminescence members are opposed to each other.

Fifth, the present invention has the fifth feature of a production method of electroluminescence device comprising steps of: preparing a transistor substrate comprising thin film transistors arranged along a plurality of rows and columns, gate lines provided for the respective rows, each gate line being a common line for connecting gates of thin film transistors on one of the rows, source lines provided for the respective columns, each source line being a common line for connecting sources of thin film transistors on one of the columns, drain electrode pads each connected to a drain of the respective thin film transistors, and capacitors connected to the respective drain electrode pads; preparing an electroluminescence substrate comprising pairs of electrodes and electroluminescence members interposed between the pairs of electrodes, which are arranged along a plurality of rows and columns; placing an adhesive electric connection member on at least one of the drain electrode pads of the transistor substrate and the electroluminescence members; placing an adhesive electric insulator around the periphery of the adhesive electric connection member on at least one of the drain electrode pads of the transistor substrate and the electroluminescence members; overlaying the thin film transistor substrate on the electroluminescence substrate opposite to each other so that the drain electrode pads and the electroluminescence members are opposed to each other; and evacuating a space between the thin film transistor substrate and the electroluminescence substrate and heating the adhesive electric connection member and adhesive electric insulator to cure said member and insulator.

Sixth, the present invention has the sixth feature of an electroluminescence apparatus having first switching devices arranged along a plurality of rows and columns, first wires provided for the respective rows, each first wire being a common wire for connecting first terminals of first switching devices on a row, second wires provided for the respective columns, each second wire being a common wire connecting second terminals of first switching devices on a column, electroluminescence elements, each having one electrode connected to a third terminal of a first switching device, other electrode, and an electroluminescence member interposed between the one and other electrodes, capacitors connected to the respective third terminals, second switching devices, each being provided between one electrode of an electroluminescence element and a third terminal of a first switching device, third wires connected to the one electrodes of the electroluminescence elements, third switching devices disposed in the third wires, and driving means, said driving means applying a first on signal pulse for turning the first switching devices on, to a first wire of a predetermined row, applying a first off signal pulse for turning the first switching devices off, to the first wires of the other rows, applying an information signal pulse of a forward bias voltage according to information, to the second wires in synchronism with the first on signal pulse, and applying a second on signal pulse for turning the second switching devices on, to a control line for the second switching devices over a predetermined period in, before, or after application of the first on signal pulse for said predetermined row, thereby activating writing into each electroluminescence member on said row; then said driving means applying a second off signal pulse for turning the second switching devices off, to said control line after the predetermined period, applying a third on signal pulse for turning the third switching devices on, to a control line for the third switching devices in, before, or after application of the second off signal pulse, thereby actuating reverse bias applying means set so that a reverse bias voltage is placed between said third wire and the other electrodes of the electroluminescence elements.

Seventh, the present invention has the seventh feature of an electroluminescence apparatus having first thin film transistors arranged along a plurality of rows and columns, first wires provided for the respective rows, each first wire being a common wire for connecting gates of first thin film transistors on a row, second wires provided for the respective columns, each second wire being a common wire for connecting sources of first thin film transistors on a column, electroluminescence elements, each having one electrode connected to a drain of a first thin film transistor, other electrode, and an electroluminescence member interposed between the one and other electrodes, second thin film transistors connected at gates thereof, each being provided between said drain and one electrode of the electroluminescence element, capacitors connected to the respective drains, first switching devices, each being provided between one electrode of an electroluminescence element and a drain electrode of a second thin film transistor, third wires, each being connected to one electrode of an electroluminescence element, second switching devices provided in said third wires, and driving means, said driving means applying a first on signal pulse for turning the first thin film transistors on, to a first wire of a predetermined row, applying a first off signal pulse for turning the first thin film transistors off, to the first wires of the other rows, applying an information signal pulse of a forward bias voltage according to information, to the second wires in synchronism with the first on signal pulse, and applying a second on signal pulse for turning the first switching devices on, to a control line for the first switching devices over a predetermined period in, before, or after application of the first on signal pulse for said predetermined row, thereby activating writing into each electroluminescence member on said row; then said driving means applying a second off signal pulse for turning the first switching devices off, to said control line after the predetermined period, and applying a third on signal pulse for turning the second switching devices on, to a control line for the third switching devices in, before, or after application of the second off signal pulse, thereby actuating reverse bias applying means set so that a reverse bias voltage is placed between said third wire and the other electrodes of the electroluminescence elements.

Eighth, the present invention has the eighth feature of an electroluminescence apparatus having: switching devices arranged along a plurality of columns and rows, first wires provided for the respective rows, each first wire being a common wire for connecting first terminals of switching devices on a row, second wires provided for the respective columns, each second wire being a common wire for connecting second terminals of switching devices on a column, and electroluminescence elements, each having one electrode connected to a third terminal of a switching device, other electrode, and an electroluminescence member interposed between the one and other electrodes; and driving means, said driving means applying a scanning selection pulse for selecting at least one row out of said plurality of rows, to a first wire corresponding to the selected row, applying an information signal pulse for bringing the electroluminescence members into a forward bias state according to information, to each of the second wires in synchronism with the scanning selection signal, and applying a bias voltage for bringing the electroluminescence members into a reverse bias state, through a third wire to the electroluminescence members before start of application of a next scanning selection signal or a scanning selection signal thereafter to the first wire corresponding to said selected row.

DETAILED DESCRIPTION OF THE PREFERRED EMBODIMENTS

The electroluminescence members are preferably media that emit the three primary colors of blue, green, and red; particularly, organic electroluminescence members.

The adhesive electric connection member is preferably a material in which electrically conductive particles are dispersed in an adhesive, and particularly preferably, a material containing a silane coupling agent.

It is preferable to employ a bond structure in which an adhesive electric insulator is disposed around the periphery of the adhesive electric connection member.

The thin film transistors are preferably of a polysilicon semiconductor, a crystal silicon semiconductor, a microcrystal silicon semiconductor, or an amorphous silicon semiconductor.

At least one electrode out of a pair of electrodes on either side of the electroluminescence member is preferably a transparent electrode of ZnO having the texture structure.

The sixth, seventh, and eighth features of the present invention permit the alternating voltage to be applied to the electroluminescence elements in active matrix driving, thereby greatly extending the continuous emission time of the organic electroluminescence members over the long term in particular.

The predetermined period used in the present invention is a period equal to ¼ to ¾ of one vertical scanning period (one frame period or one field period), preferably a period equal to ⅓ to ⅔ thereof, and particularly optimally, a period equal to approximately ½ thereof.

A time average voltage of the forward bias voltage and reverse bias voltage used in the present invention is preferably set to approximately zero.

The present invention will be described by reference to the drawings. In the following description, the thin film transistor described above will be denoted by "TFT" and the electroluminescence member by "EL."

Figure 1:
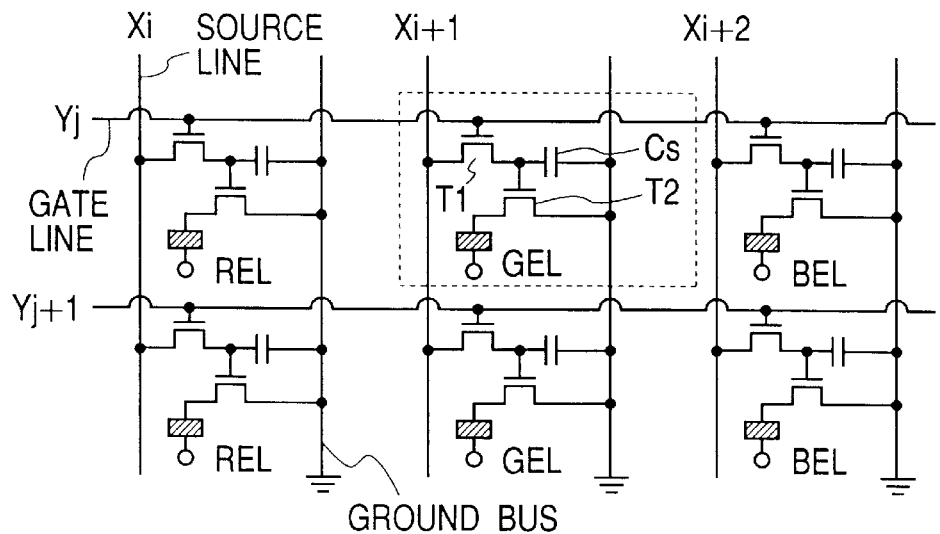
FIG. 1 is an equivalent circuit diagram of an EL device of the present invention.

FIG. 1 is a schematic diagram of an active matrix four-terminal TFT-EL device. A device of each pixel includes two TFTs, a storage capacitor, and an EL device. A principal feature of the four-terminal type is the capability of separating an addressing signal from an EL excitation signal. The EL device is selected through the logic TFT (T1) and excitation power to the EL device is controlled by the power TFT (T2). The storage capacitor makes it possible to keep the excitation power staying in the addressed EL device once selected. Thus the circuit permits the EL device to operate at the duty cycle close to 100%, ignoring the time assigned to addressing.

Gate lines $Y_j$, $Y_{j+1}$ are preferably a lot of wires, for example 640 wires or 1120 wires, to which gate pulses are applied in order. The gate pulses may be of either interlace scanning or non-interlace scanning.

Source lines $X_i$, $X_{i+1}$, $X_{i+2}$ are preferably a lot of wires, for example 840 wires or 1280 wires, to which information signal pulses of a voltage set according to image data are applied in synchronism with the gate pulses.

In the drawing REL designates red-emitting EL, GEL green-emitting EL, and BEL blue-emitting EL; information signal pulses of red are applied to the source line $X_i$, green information pulses to $X_{i+1}$, and blue information pulses to $X_{i+2}$. This achieves the full-color display.

Figure 2:
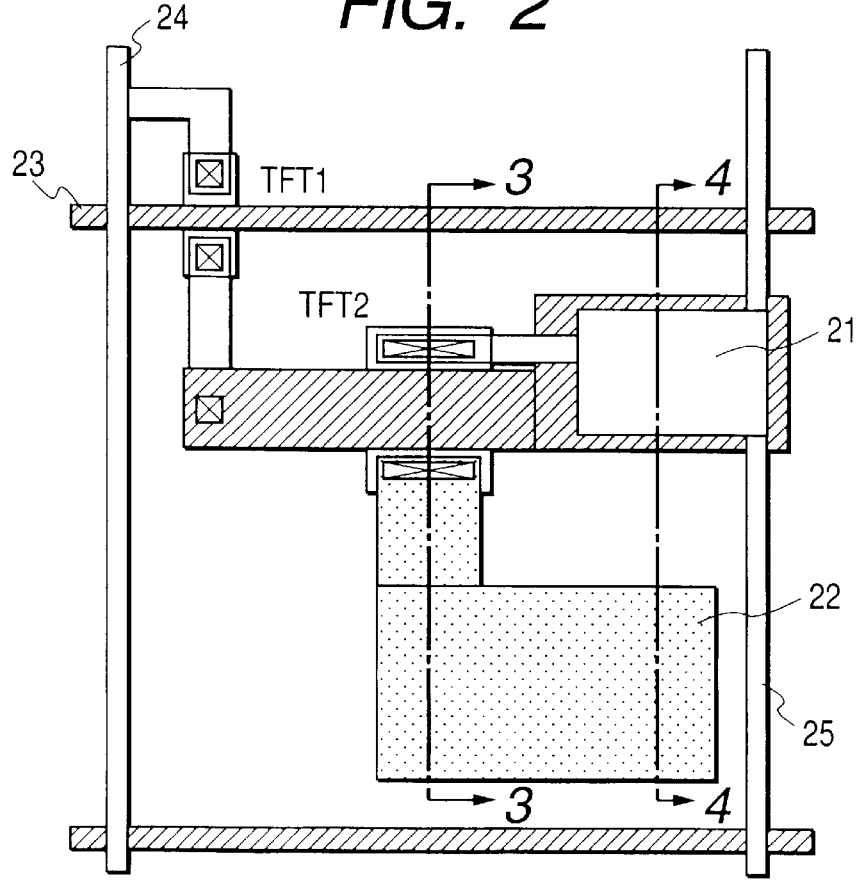
FIG. 2 is a plan view of an EL pixel on the TFT substrate side, used in the EL device of the present invention.

FIG. 2 is a plan view to show a typical example of TFT substrate 3 according to the present invention. TFT 1 corresponds to T1 of FIG. 1, TFT 2 to T2 of FIG. 1, capacitor 21 to Cs of FIG. 1, and drain electrode pad 22 to an electrode connected to the drain of T2 in each EL of FIG. 1.

Figure 3:
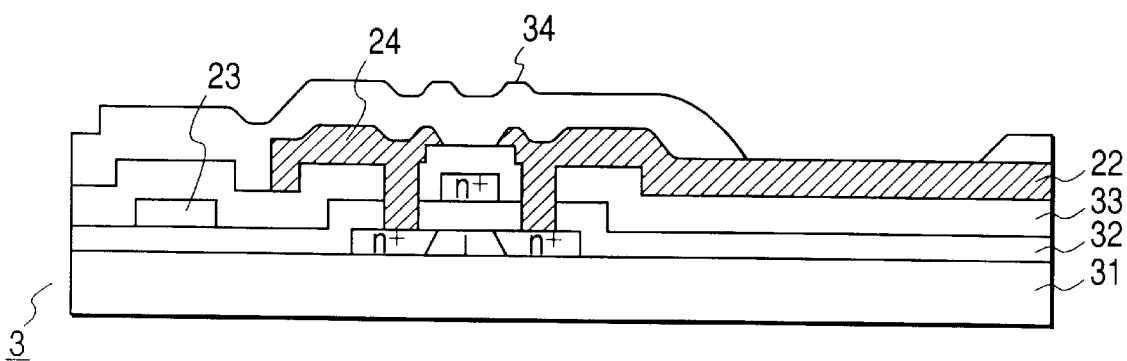
FIG. 3 is a sectional view along line 3—3 in FIG. 2.
Figure 4:
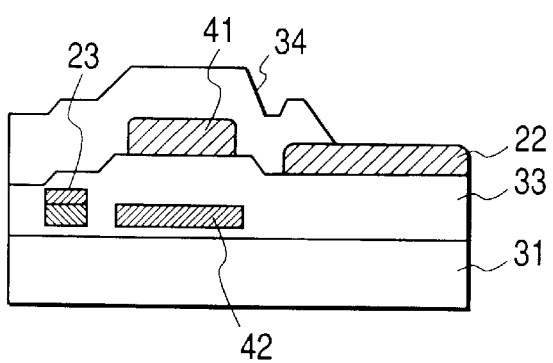
FIG. 4 is a sectional view along line 4—4 in FIG. 2.

FIG. 3 is a sectional view along line 3—3 in FIG. 2. FIG. 4 is a sectional view along line 4—4 in FIG. 2.

TFT 1 and TFT 2 used in the present invention have such transistor structure that source bus 24 is connected to $n^+$ polysilicon, the drain to $n^+$ polysilicon, PECVD (plasma-enhanced CVD)-$SiO_2$ film 32 is placed as a gate insulating film on either side of the i-type polysilicon film, and the gate bus is connected to $n^+$ polysilicon. Reference numeral 31 refers to a base substrate.

The present invention is not limited to the aforementioned transistor structure, but may adopt either the stagger structure or the coplanar structure using amorphous silicon or microcrystalline silicon semiconductors.

The present invention can be applied to MOS transistors of the SOI (silicon on insulator) structure using crystal silicon.

The capacitor Cs is composed of a pair of capacitor electrodes 41 and 42, and $SiO_2$ film 33 interposed between the pair of capacitor electrodes as shown in FIG. 4. The capacitor electrode 41 is a film formed of Al or the like and connected to the ground bus 25, while the capacitor electrode 42 is a film formed of $n^+$ polysilicon and connected to the drain of TFT 2.

The gate bus 23 and source bus 24 are preferably chromium/aluminum layered wires.

A passivation film 34 is preferably a film of silicon nitride formed by plasma CVD.

A metal film of aluminum, silver, or the like can be used as the drain electrode pad 22 in order to provide it with reflecting performance, but a transparent conductive film such as ITO or ZnO may also be applied.

Figure 5:
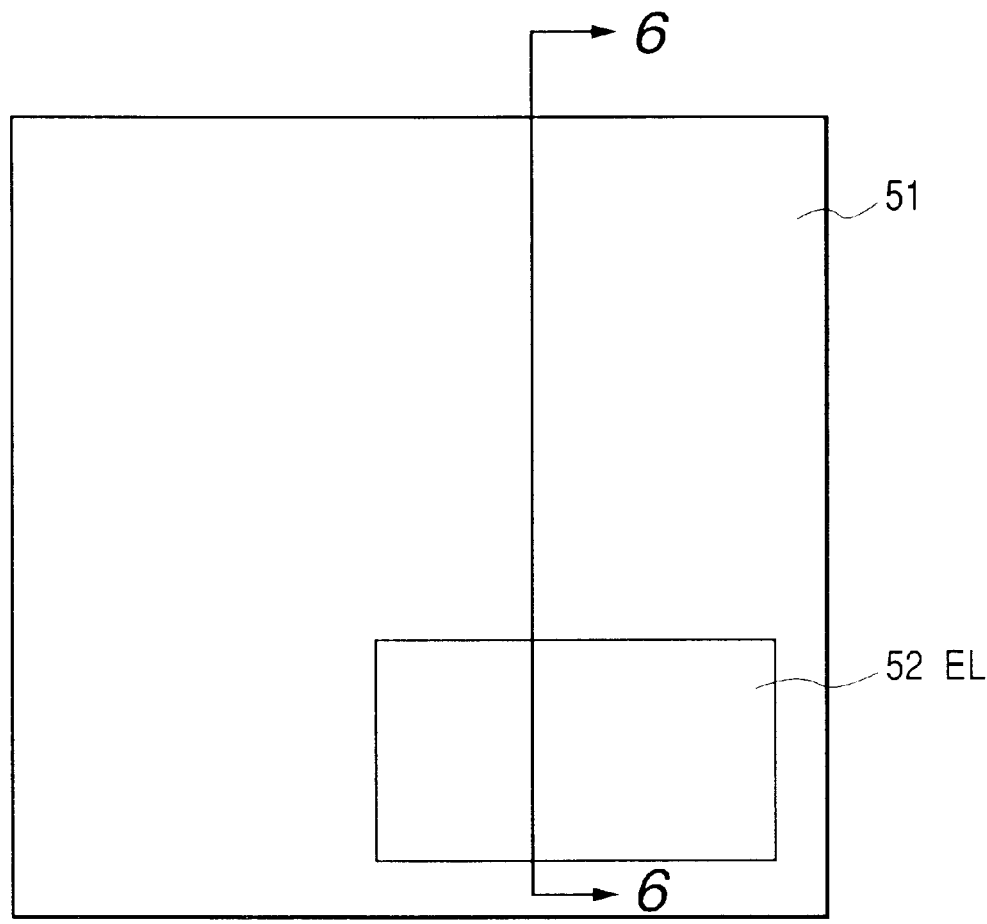
FIG. 5 is a plan view of an EL pixel on the EL substrate side, used in the EL device of the present invention.
Figure 6:
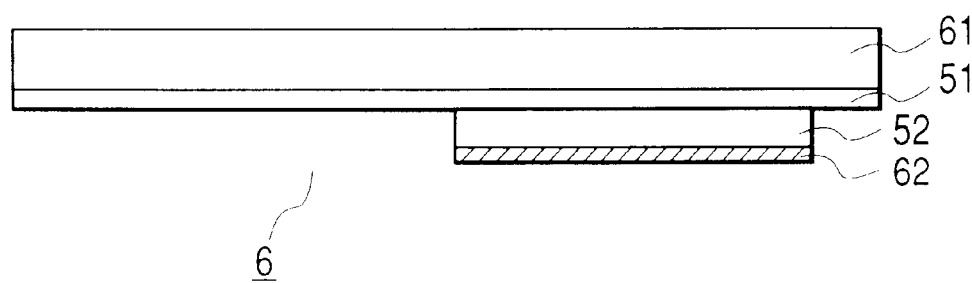
FIG. 6 is a sectional view along line 6—6 in FIG. 5.

FIG. 5 is a plan view of EL substrate 6 used in the present invention and FIG. 6 is a sectional view along line 6—6 in FIG. 5.

The EL substrate 6 is composed of glass substrate 61, a pair of electrodes disposed on the glass substrate 61, i.e., a transparent electrode 51 and an EL electrode pad 62 of aluminum or the like forming a reflecting surface, and the EL interposed between the pair of electrodes.

The EL 52 is preferably an organic EL; particularly, either one of those forming REL, GEL, and BEL is placed.

Specific examples of REL, GEL, and BEL are listed below, but it is noted that the present invention is not intended to be limited to these examples and that inorganic ELs can also be applied instead of the organic ELs.

Materials applicable as the organic ELs in the present invention are those disclosed, for example, in Scozzafava's EPA 349,265 (1990); Tang's U.S. Pat. No. 4,356,429; VanSlyke et al.'s U.S. Pat. No. 4,539,507; VanSlyke et al.'s U.S. Pat. No. 4,720,432; Tang et al.'s U.S. Pat. No. 4,769, 292; Tang et al.'s U.S. Pat. No. 4,885,211; Perry et al.'s U.S. Pat. No. 4,950,950; Littman et al.'s U.S. Pat. No. 5,059,861; VanSlyke's U.S. Pat. No. 5,047,687; Scozzafava et al.'s U.S. Pat. No. 5,073,446; VanSlyke et al.'s U.S. Pat. No. 5,059, 862; VanSlyke et al.'s U.S. Pat. No. 5,061,617; VanSlyke's U.S. Pat. No. 5,151,629; Tang et al.'s U.S. Pat. No. 5,294, 869; Tang et al.'s U.S. Pat. No. 5,294,870. The EL layer is comprised of an organic hole injection and transporting zone in contact with the anode, and an electron injection and transporting zone which forms a junction with the organic hole injection and transporting zone. The hole injection and transporting zone is made of a single material or plural materials, and comprises a hole injection layer in contact with the anode and a contiguous hole transporting layer interposed between the hole injection layer and the electron injection and transporting zone. Similarly, the electron injection and transporting zone is made of a single material or plural materials, and comprises an electron injecting layer in contact with the cathode and a contiguous electron transporting layer that is interposed between the electron injection layer and the hole injection and transporting zone. Recombination of hole and electron and luminescence occurs in the electron injection and transporting zone adjacent to the junction between the electron injection and transporting zone and the hole injection and transporting zone. Compounds forming the organic EL layer are deposited typically by vapor deposition, but they may also be deposited by other conventional technologies.

In a preferred embodiment the organic material of the hole injection layer has the general formula below.

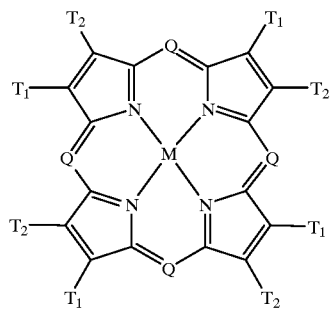

In the above formula, Q represents N or C-R (where R is hydrogen, alkyl, or halogen), M is a metal, a metal oxide, or a metal halide, and T1, T2 represent hydrogen or both make up an unsaturated six-membered ring containing a substituent such as alkyl or halogen. A preferred alkyl part contains approximately one to six carbon atoms, while phenyl composes a preferred aryl part.

In a preferred embodiment the hole migration layer is aromatic tertiary amine. A preferred subclass of the aromatic tertiary amine contains tetraaryldiamine having the following formula.

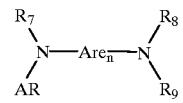

In the above formula Are represents arylene, n an integer from 1 to 4, and Ar, $R_7$, $R_8$, $R_9$ each an aryl group selected. In a preferred embodiment the luminescence, electron injection and transporting zone contains a metal oxinoid compound. A preferred example of the metal oxinoid compound has the general formula below.

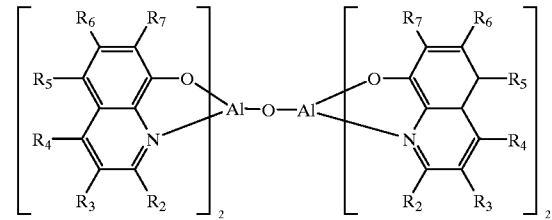

In this formula $R_2$ to $R_7$ represent substitutional possibilities. In another preferred embodiment the metal oxinoid compound has the following formula.

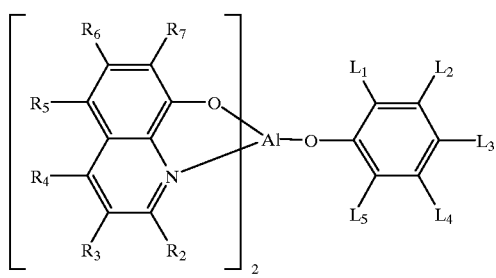

In the above formula $R_2$ to $R_7$ are those defined above, and L1 to L5 collectively contain twelve or fewer carbon atoms, each independently representing hydrogen or a hydrocarbon group of 1 to 12 carbon atoms, wherein L1, L2 together, or L2, L3 together can form a united benzo ring. In another preferred embodiment the metal oxinoid compound has the following formula.

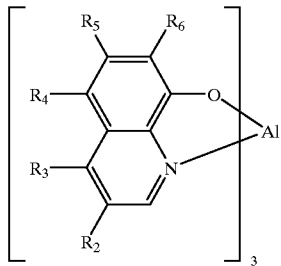

In this formula $R_2$ to $R_6$ represent hydrogen or other substitutional possibilities. The above examples only represent some preferred organic materials simply used in the electroluminescence layer. Those are not described herein for the intention of limiting the scope of the present invention, but generally indicate the organic electroluminescence layer. As understood from the above examples, the organic EL materials include the coordinate compounds having the organic ligand.

In the next process stage the EL anode 62 is deposited on the surface of device. The EL anode can be made of any electrically conductive material, but it is preferably made of a material having the work function of 4 eV or less (see the Tang's U.S. Pat. No. 4,885,211). Materials having a low work function are preferable for the anode. It is because they readily release electrons into the electron transporting layer. Metals having the lowest work function are alkali metals, but instability thereof in the air makes use thereof impractical under certain conditions. The cathode material is deposited typically by chemical vapor deposition, but other suitable deposition technologies can also be applied. It was found that a particularly preferred material for the EL cathode is a magnesium: silver alloy of 10:1 (in an atomic ratio). Preferably, the cathode layer is applied as a continuous layer over the entire surface of display panel. In another embodiment the EL cathode is comprised of a lower layer of a metal with a low work function adjacent to the organic electron injection and transporting zone, and a protective layer overlaid on the metal with the low work function to protect the metal with the low work function from oxygen and humidity.

Typically the cathode material is opaque, while the anode material is transparent, so that light passes through the anode material. However, in an alternative embodiment light is emitted through the cathode rather than the anode. In this case the cathode must be light transmissive and the anode may be opaque. A practical balance light transmission and technical conductance is typically in the thickness range of 5 to 25 nm.

In the present invention a plastic film can be used instead of the glass substrate 61 used for the EL substrate 6, and ITO or ZnO can be used for the transparent electrode 51.

In order to increase the surface area of EL 52, the texture structure having fine unevenness in the surface thereof can be employed for the transparent electrode 51. The preferred texture structure can be formed by a sputter process under such condition of relatively high temperature that the substrate temperature during deposition of ZnO is 250° C. to 300° C.

The area except for EL 52 in the transparent electrode 51 can be provided with a shield mask (not illustrated). The shield mask in this case can be a metal film such as an aluminum film or a chromium film, or a chromium oxide film or an aluminum oxide film for preventing occurrence of reflected light due to these metal films, singly or deposited on the metal film.

Since the metal film substantially decreases the resistance of the transparent electrode 51, it is preferred to deposit the metal film on the transparent electrode 51 and further lay the metal oxide film thereon.

The transparent electrode 51 is set to the earth or a predetermined dc voltage during driving of the EL devices of the present invention.

Figure 7:
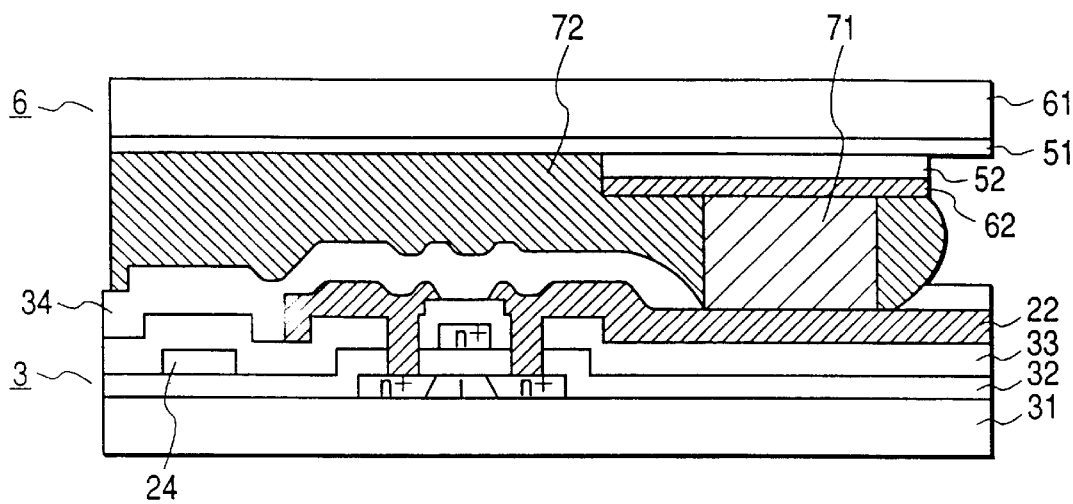
FIG. 7 is a sectional view of an EL device of the present invention.

FIG. 7 is a sectional view of an EL device according to the present invention. The EL device is constructed in such structure that TFT substrate 3 and EL substrate 6 are opposed to each other, whereby the EL electrode pad 62 on the EL substrate 6 side and the drain electrode pad 22 on the TFT substrate 3 side are opposed, and that electrical connection is achieved between the both electrodes by adhesive electric connection member 71.

The adhesive electric connection member 71 is obtained by using an electrically conductive adhesive in which electrically conductive particles such as carbon particles, silver particles, or copper particles are dispersed in an epoxy-based or phenol-based thermosetting adhesive, applying it to a predetermined position of the EL substrate 6 or the TFT substrate 3, or the both by a screen printing method, an offset printing method, or a dispenser applying method, and drying it.

The electrically conductive adhesive described above may contain a silane coupling agent such as N-(2-aminoethyl)-3-aminopropylmethyldimethoxysilane, N-(2-aminoethyl)-3-aminopropyltrimethoxysilane, 3-aminopropyltrimethoxysilane, 3-aminopropylmethyldiethoxysilane, or 3-glycidoxypropyltrimethoxysilane, for enhancing interfacial adhesive strength.

Another example of the adhesive electric connection member 71 is solder.

An adhesive electric insulator 72 is provided around the periphery of the adhesive electric connection member 71 described above. The adhesive electric insulator 72 is obtained by applying an epoxy-based or phenol-based insulative adhesive to a predetermined position of the EL substrate 6 or the TFT substrate, or the both by a method such as the offset printing method, the screen printing method, or the dispenser applying method, and drying it. On this occasion, in applying the insulative adhesive and the conductive adhesive, it is preferred to employ a production method for laying the insulative adhesive on either one of the EL substrate 6 and the TFT substrate 3 and laying the conductive adhesive on the other substrate without the insulative adhesive.

In the present invention, the above-stated adhesive insulator 72 can be replaced by an insulator having no adhesive strength, for example an organic solvent, and particularly, a high-boiling-point organic solvent or a liquid insulator of liquid crystal such as nematic liquid crystal, cholesteric liquid crystal, or smectic liquid crystal.

The aforementioned adhesive insulator 72 or non-adhesive insulator may also contain such a coloring agent as a color pigment or a paint in order to be also provided with the shield effect.

The EL device of the present invention can be produced by employing a method for applying the conductive adhesive onto the drain electrode pad 22 of TFT substrate 3, for example, by the offset printing method, applying the insulative adhesive to the area (around the periphery of the EL electrode pad 62) except for the EL electrode pad 62 of the EL substrate 6, for example, by the offset printing method, overlaying the EL substrate 6 on the TFT substrate 3 so that the drain electrode pad 22 and the EL electrode pad 62 are opposed to each other, then evacuating the air of the space between the TFT substrate 3 and the EL substrate 6 by an ordinary method, and applying pressure and heat to the both substrates 3 and 6 to fix them in adhesion.

Figure 8:
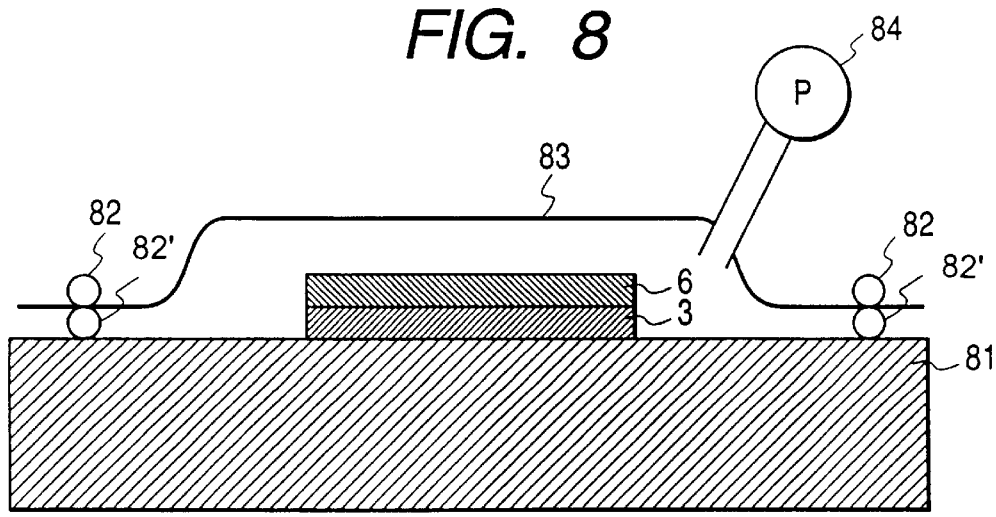
FIG. 8 is a sectional view of an evacuation system used in the method of the present invention.

FIG. 8 shows an evacuating device used on the occasion of evacuation of the air of the space described above. With keeping the TFT substrate 3 and the EL substrate 6 in a superimposed state, they are placed on stage 81, they are covered as illustrated by sheet 83 of plastic film or the like placed between a pair of O-rings 82 and 82 fixed in the periphery, and thereafter vacuum pump 84 is actuated to evacuate the air of the inside of the sheet 83.

Figure 9:
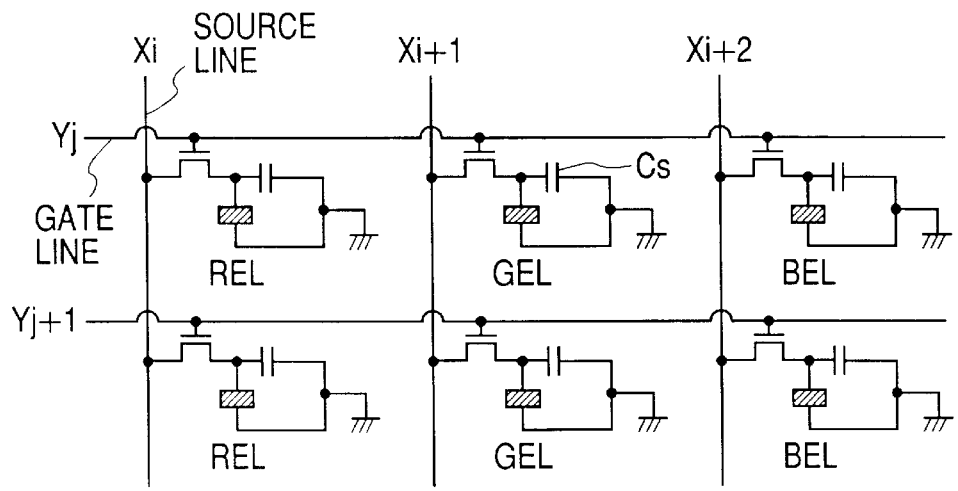
FIG. 9 is an equivalent circuit diagram of another EL device of the present invention.

FIG. 9 is an equivalent circuit diagram of another EL device of the present invention.

Figure 10:
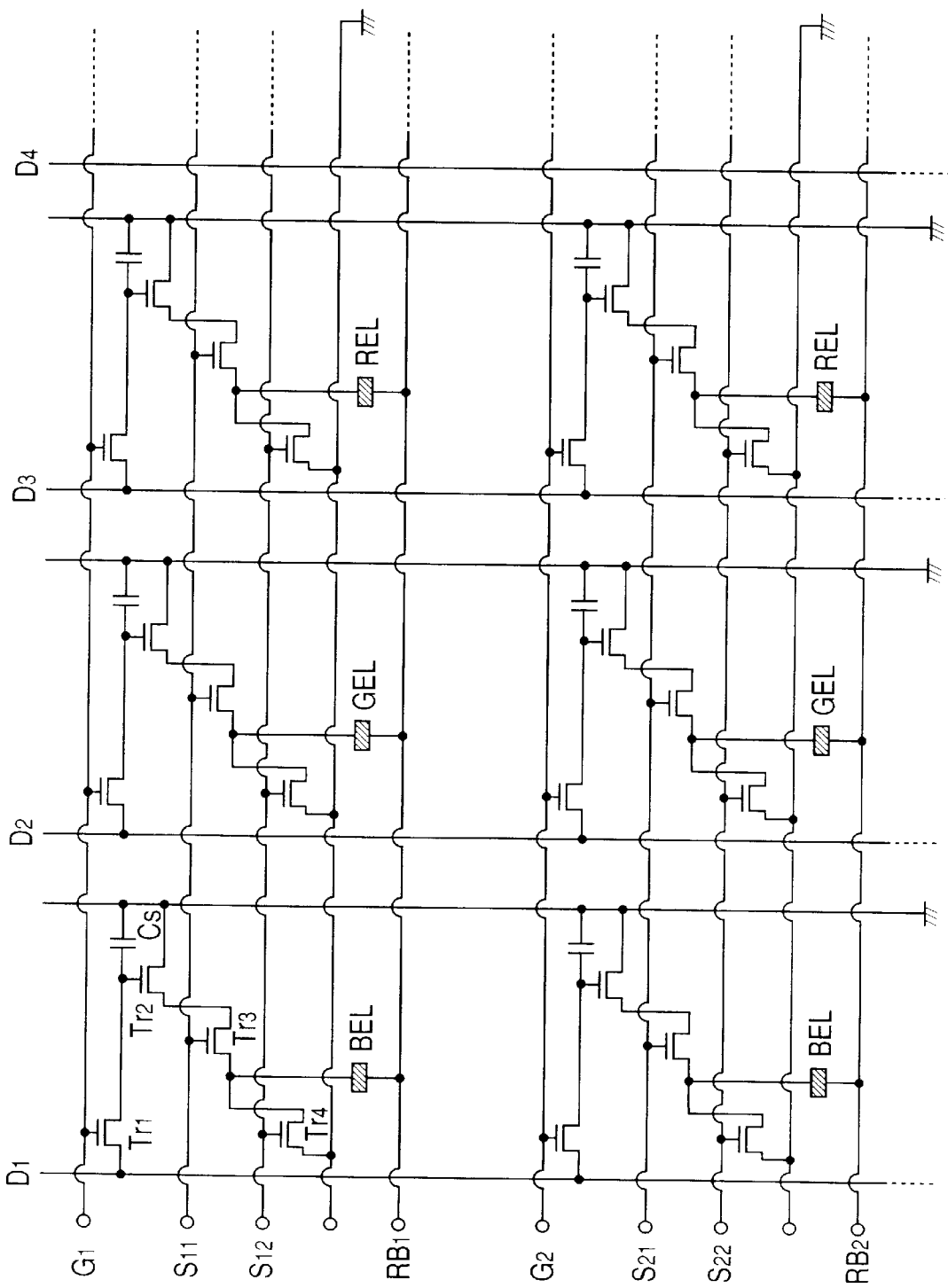
FIG. 10 is an equivalent circuit diagram of an EL apparatus used in another embodiment of the present invention.
Figure 11:
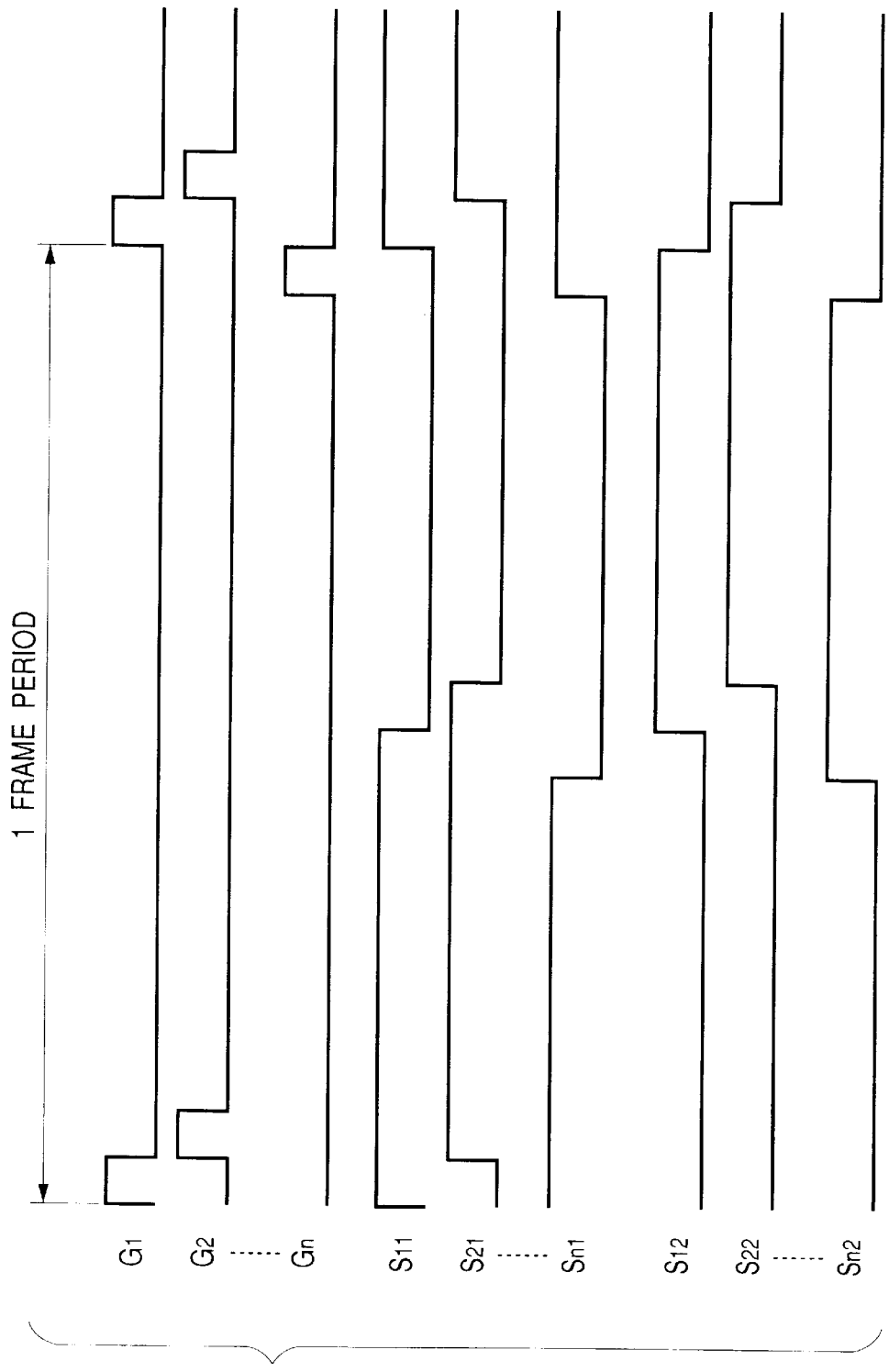
FIG. 11 is a timing chart of driving used in the present invention.

FIG. 10 and FIG. 11 illustrate an embodiment associated with the sixth, seventh, and eighth features of the present invention.

$G_1, G_2, \ldots, G_n$ (n gate scanning lines) are gate on pulses (high-level voltage) successively applied to gate lines connected to the gates of switching devices $Tr_1$ comprised of thin film transistors, and write rows are selected by successive application of the gate on pulses. The gate on pulses $G_1, G_2, \ldots, G_n$ being scanning selection signals may be applied either by the interlace scanning method or by the non-interlace scanning method. In the case of the driving by the interlace scanning method, scanning may be the interlace scanning with interlacing of one line or with interlacing of two or more lines.

$S_{11}, S_{21}, \ldots, S_{n1}$ are control pulses for controlling the emission time of EL, which are applied to the gates of switching devices $Tr_3$ comprised of thin film transistors during a predetermined emission period. The control pulses are applied thereto in, before, or after application of the gate on pulse (high-level voltage) of $G_1, G_2, \ldots, G_n$, and the ELs this time are set in the forward bias state.

$S_{12}, S_{22}, \ldots, S_{n2}$ interrupt emission of EL and, in order to apply a reverse bias voltage to the ELs through bias control line $RB_1, RB_2, \ldots, RB_n$ instead, they are applied as gate on pulses (high-level voltage) to the gates of switching devices $Tr_4$ comprised of thin film transistors, in, before, or after application of a gate off pulse (low-level voltage) to the switching devices $Tr_3$.

Figure 12:
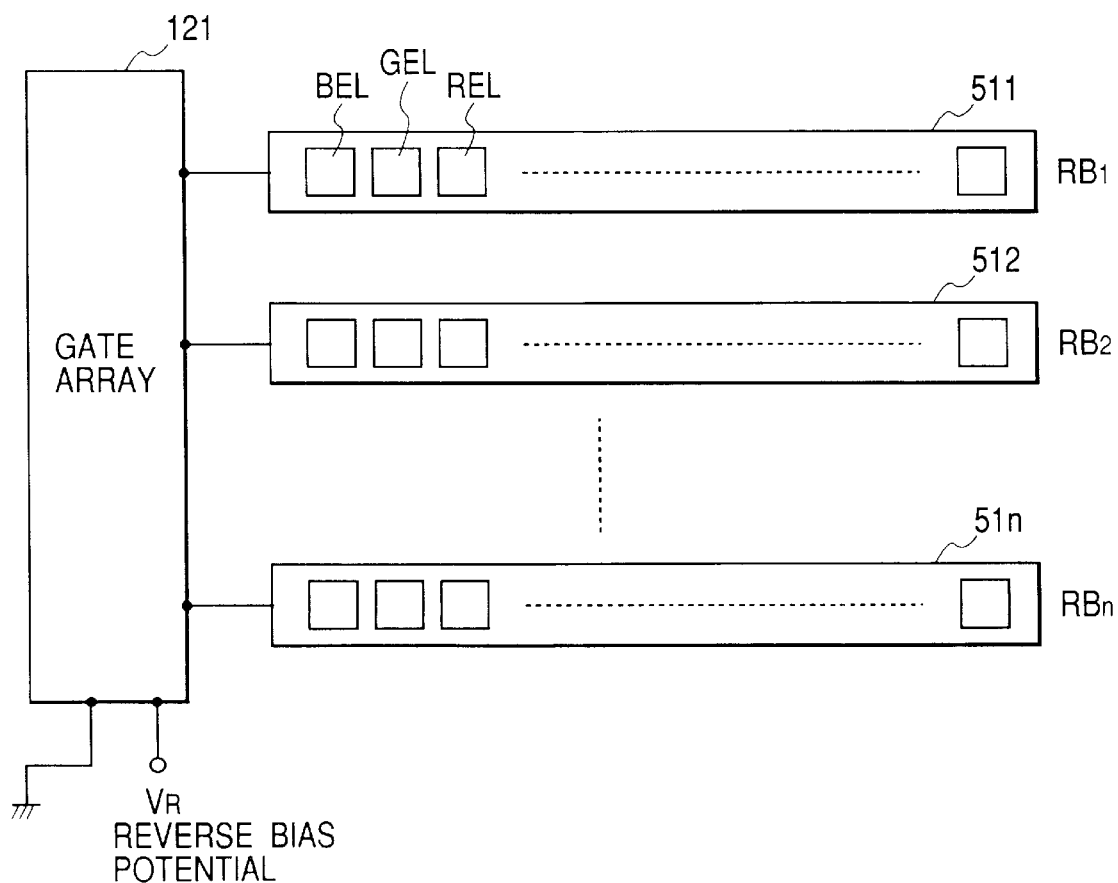
FIG. 12 is a plan view of an EL substrate used in the present invention.

The bias control lines $RB_1, RB_2, \ldots, RB_n$ are preferably placed on the EL substrate 6, as shown in FIG. 12. In this case, the bias control lines $RB_1, RB_2, \ldots, RB_n$ are arranged in such a way that parallel transparent electrodes $51_1, 51_2, \ldots, 51_n$ are provided for the respective rows of plural switching devices $Tr_1$ being active matrix driving devices and each transparent electrode $51_1, 51_2, \ldots, 51_n$ is switched independently through gate array 121 to either one of the earth and reverse bias voltage $V_R$. Based on this arrangement, the ELs are driven on the occasion of emission of EL so that the potential thereof is set in the forward bias state.

In FIG. 10 $D_1, D_2, D_3, D_4, \ldots, D_m$ (m information lines) supply information signal pulses according to information, applied according to the information to the sources of the switching devices $Tr_1$ on the columns, and set the forward bias state for the ELs (BELs, GELs, RELs).

According to the sixth, seventh, and eighth features of the present invention, the alternating voltage was applied to each EL and display was achieved by continuous emission over the long term.

The present invention is suitably applicable to the light-emitting display layer, but the invention can also be applied in place of laser signals, LED signals, or liquid crystal shutter array signals (solid state scanner signals) used in a light signal generator for electrophotographic printer.

The present invention permitted the EL pixels with high definition, high density, and long life to be produced across a large area and with high productivity.

The present invention achieved high-luminance light emission of EL and provided the EL devices, based on the high productivity, thus achieving the EL color display with high definition, high density, and continuous high-luminance emission over the long term.

Further, the present invention provided the EL color display achieving stability against impact and display stability in long-term use.

What is claimed is:

1. An electroluminescence device having a transistor substrate comprising a first substrate, thin film transistors arranged along a plurality of rows and columns on said first substrate, gate lines provided for the respective rows on said first substrate, each gate line being a common line for connecting gates of thin film transistors on one of the rows, source lines provided for the respective columns, each source line being a common line for connecting sources of thin film transistors on one of the columns on said first substrate, drain electrode pads each connected to a drain of the respective thin film transistors on said first substrate, and capacitors connected to the respective drain electrode pads on said first substrate; and an electroluminescence substrate comprising a second substrate, pairs of electrodes and electroluminescence members interposed between the pairs of electrodes on said second substrate, which are arranged along a plurality of rows and columns, wherein said thin film transistor substrate and electroluminescence substrate are placed opposite to each other so that the drain electrode pads and the electroluminescence members are opposed to each other, and wherein each drain electrode pad is connected through an adhesive electric connection member to one of a pair of electrodes of said electroluminescence member.

2. The electroluminescence device according to claim 1, wherein said electroluminescence members comprise media that emit the three primary colors of blue, green and red.

3. The electroluminescence device according to claim 1, wherein said electroluminescence members comprise media of organic substance that emit the three primary colors of blue, green and red.

4. The electroluminescence device according to claim 1, wherein said adhesive electric connection member is a material in which electrically conductive particles are dispersed in an adhesive.

5. The electroluminescence device according to claim 1, wherein said adhesive electric connection member is a material in which electrically conductive particles are dispersed in an adhesive and which contains a silane coupling agent.

6. The electroluminescence device according to claim 1, wherein an electric insulator is disposed around the periphery of said adhesive electric connection member.

7. The electroluminescence device according to claim 1, wherein an adhesive electric insulator is disposed around the periphery of said adhesive electric connection member.

8. The electroluminescence device according to claim 1, wherein an electric insulator containing a coloring agent is disposed around the periphery of said adhesive electric connection member.

9. The electroluminescence device according to claim 1, wherein an electric insulator of a liquid form is disposed around the periphery of said adhesive electric connection member.

10. The electroluminescence device according to claim 1, wherein said thin film transistors have a polysilicon semiconductor layer.

11. The electroluminescence device according to claim 1, wherein said thin film transistors have an amorphous silicon semiconductor or a microcrystalline silicon semiconductor.

12. The electroluminescence device according to claim 1, wherein said thin film transistors have a crystal silicon semiconductor.

13. The electroluminescence device according to claim 1, wherein at least one electrode out of the pair of electrodes on either side of each said electroluminescence member is a transparent electrode having the texture structure.

14. The electroluminescence device according to claim 1, wherein at least one electrode out of the pair of electrodes on either side of each said electroluminescence member is a transparent electrode of ZnO having the texture structure.

15. An electroluminescence device having a transistor substrate comprising a first substrate, first thin film transistors arranged along a plurality of rows and columns on said first substrate, gate lines provided for the respective rows on said first substrate, each gate line being a common line for connecting gates of first thin film transistors on one of the rows, source lines provided for the respective columns on said first substrate, each source line being a common line for connecting sources of first thin film transistors on one of the columns, second thin film transistors each connected to a drain of the respective first thin film transistors on said first substrate, and capacitors connected to the respective second thin film transistors on said first substrate, wherein a gate of each second thin film transistor is connected to the drain of the first thin film transistor, a drain electrode pad is connected to a drain of each second thin film transistor, and a source of each second thin film transistor is connected to one electrode of the capacitor; and an electroluminescence substrate comprising a second substrate, pairs of electrodes and electroluminescence members interposed between the pairs of electrodes on said second substrate, which are arranged along a plurality of rows and columns, wherein said thin film transistor substrate and electroluminescence substrate are placed opposite to each other so that the drain electrode pads and the electroluminescence members are opposed to each other, and wherein each drain electrode pad is connected through an adhesive electric connection member to one of a pair of electrodes of said electroluminescence member.

16. The electroluminescence device according to claim 15, wherein said electroluminescence members comprise media that emit the three primary colors of blue, green and red.

17. The electroluminescence device according to claim 15, wherein said electroluminescence members comprise media of organic substance that emit the three primary colors of blue, green and red.

18. The electroluminescence device according to claim 15, wherein said adhesive electric connection member is a material in which electrically conductive particles are dispersed in an adhesive.

19. The electroluminescence device according to claim 15, wherein said adhesive electric connection member is a material in which electrically conductive particles are dispersed in an adhesive and which contains a silane coupling agent.

20. The electroluminescence device according to claim 15, wherein an adhesive electric insulator is disposed around the periphery of said adhesive electric connection member.

21. The electroluminescence device according to claim 15, wherein said thin film transistors have a polysilicon semiconductor layer.

22. The electroluminescence device according to claim 15, wherein said thin film transistors have an amorphous silicon semiconductor or a microcrystalline silicon semiconductor.

23. The electroluminescence device according to claim 15, wherein said thin film transistors have a crystal silicon semiconductor.

24. A production method of electroluminescence device comprising steps of:

preparing a transistor substrate comprising a first substrate, thin film transistors arranged along a plurality of rows and columns on said first substrate, gate lines provided for the respective rows on said first substrate, each gate line being a common line for connecting gates of thin film transistors on one of the rows, source lines provided for the respective columns on said first substrate, each source line being a common line for connecting sources of thin film transistors on one of the columns, drain electrode pads each connected to a drain of the respective thin film transistors on said first substrate, and capacitors connected to the respective drain electrode pads on said first substrate;

preparing an electroluminescence substrate comprising a second substrate, pairs of electrodes and electroluminescence members interposed between the pairs of electrodes on said second substrate, which are arranged along a plurality of rows and columns;

placing an adhesive electric connection member on at least one of the drain electrode pads of the transistor substrate and the electroluminescence members; and overlaying the thin film transistor substrate on the electroluminescence substrate opposite to each other so that the drain electrode pads and the electroluminescence members are opposed to each other.

25. The production method of electroluminescence device according to claim 24, wherein said electroluminescence members comprise media that emit the three primary colors of blue, green and red.

26. The production method of electroluminescence device according to claim 24, wherein said electroluminescence members comprise media of organic substance that emit the three primary colors of blue, green and red.

27. The production method of electroluminescence device according to claim 24, wherein said adhesive electric connection member is a material in which electrically conductive particles are dispersed in an adhesive.

28. The production method of electroluminescence device according to claim 27, wherein said adhesive electric connection member is a material in which the electrically conductive particles are dispersed in the adhesive and which contains a silane coupling agent.

29. A production method of electroluminescence device comprising steps of:

preparing a transistor substrate comprising a first substrate, thin film transistors arranged along a plurality of rows and columns on said first substrate, gate lines provided for the respective rows on said first substrate, each gate line being a common line for connecting gates of thin film transistors on one of the rows source lines provided for the respective columns on said first substrate, each source line being a common line for connecting sources of thin film transistors on one of the columns, drain electrode pads each connected to a drain of the respective thin film transistors on said first substrate, and capacitors connected to the respective drain electrode pads on said first substrate;

preparing an electroluminescence substrate comprising a second substrate, pairs of electrodes and electroluminescence members interposed between the pairs of electrodes on said second substrate, which are arranged along a plurality of rows and columns; placing an adhesive electric connection member on at least one of the drain electrode pads of the transistor substrate and the electroluminescence members;

placing an adhesive electric insulator around the periphery of the adhesive electric connection member on at least one of the drain electrode pads of the transistor substrate and the electroluminescence members; and overlaying the thin film transistor substrate on the electroluminescence substrate opposite to each other so that the drain electrode pads and the electroluminescence members are opposed to each other.

30. A production method of electroluminescence device comprising steps of:

preparing a transistor substrate comprising a first substrate, thin film transistors arranged along a plurality of rows and columns on said first substrate, gate lines provided for the respective rows on said first substrate, each gate line being a common line for connecting gates of thin film transistors on one of the rows, source lines provided for the respective columns on said first substrate, each source line being a common line for connecting sources of thin film transistors on one of the columns, drain electrode pads each connected to a drain of the respective thin film transistors on said first substrate, and capacitors connected to the respective drain electrode pads on said first substrate;

preparing an electroluminescence substrate comprising a second substrate, pairs of electrodes and electroluminescence members interposed between the pairs of electrodes on said second substrate, which are arranged along a plurality of rows and columns;

placing an adhesive electric connection member on at least one of the drain electrode pads of the transistor substrate and the electroluminescence members;

placing an adhesive electric insulator around the periphery of the adhesive electric connection member on at least one of the drain electrode pads of the transistor substrate and the electroluminescence members;

overlaying the thin film transistor substrate on the electroluminescence substrate opposite to each other so that the drain electrode pads and the electroluminescence members are opposed to each other; and evacuating a space between the thin film transistor substrate and the electroluminescence substrate and heating the adhesive electric connection member and adhesive electric insulator to cure said member and insulator.

* * * * *

UNITED STATES PATENT AND TRADEMARK OFFICE
CERTIFICATE OF CORRECTION

PATENT NO. : 6,175,345 B1
DATED : January 16, 2001
INVENTOR(S) : Masaki Kuribayashi et al.

It is certified that error appears in the above-identified patent and that said Letters Patent is hereby corrected as shown below:

<u>Column 11,</u>
Line 17, "82" should read -- 82' --.

Signed and Sealed this

Eighteenth Day of December, 2001

Attest:

Attesting Officer

JAMES E. ROGAN
*Director of the United States Patent and Trademark Office*